Sept. 8, 1959 N. K. WALKER 2,903,629
ENCAPSULATED SEMICONDUCTOR ASSEMBLY
Filed Oct. 23, 1958
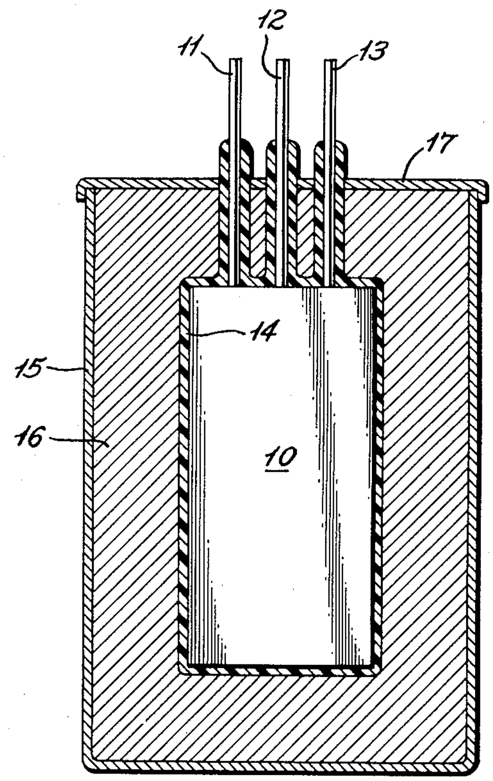
INVENTOR
Norman K. Walker
BY Sughrue & Rothwell
ATTORNEYS 2,903,629
Patented Sept. 8, 1959

2,903,629

ENCAPSULATED SEMICONDUCTOR ASSEMBLY

Norman K. Walker, Kensington, Md., assignor to Advanced Research Associates, Incorporated, Kensington, Md.

Application October 23, 1958, Serial No. 769,246

6 Claims. (Cl. 317—234)

This invention relates to method and apparatus for encapsulating a semiconductor assembly and more particularly to such method and apparatus for encapsulating a semiconductor assembly to provide excellent thermal characteristics.

Because semiconductor elements are so sensitive to temperature, much effort has been made to thermally compensate these elements. One direction that these efforts has taken is towards providing a means for housing or encapsulating these elements wherein good heat transfer is achieved. Prior efforts along these lines have, however, not been entirely satisfactory.

It is therefore an object of this invention to provide a method and apparatus for encapsulating a semiconductor element to provide improved thermal compensation characteristics.

The above object and other objects will be apparent from a detailed description of the accompanying drawings.

In the drawing:

The single figure is a diagrammatic view of an encapsulated semiconductor element constructed in accordance with this invention.

Referring to the drawing, the semiconductor element housing 10, which houses the semiconductor element, may be of conventional metallic or plastic design. The invention contemplates not only a semiconductor element of the usual PNP and NPN transistor type but also diodes and multi-zoned transistors such as the commonly known hook type. Additionally, the invention contemplates either point contact or junction type semiconductors. The electrodes 11, 12 and 13 engage the semiconductor element within the housing 10 at junction areas thereon. The entire surface of the housing 10 is coated with a conventional insulating material, only in the event that said housing is metallic, and this coating is illustrated by numeral 14 in the drawing. This insulating material 14 in any event coats the electrodes 11, 12 and 13 up to within a terminal portion at the ends of these electrodes.

By suitable means the insulated coated housing 10 is positioned within an encapsulating housing 15 and a metallic composition 16 while in the molten state is poured around the housing 10 and the electrodes associated therewith. The housing 15 may be any conventional housing which of course has a higher melting point than that of the molten metal. It may be a plastic or metallic composition. The housing is sealed at 17. The molten metallic composition has a melting point which is intermediate between maximum junction area temperature for the semiconductor element and the maximum working temperature of the atmospheric exterior to the semiconductor element. In the usual case, the junction temperature should not exceed 95° C. to 100° C. and the maximum outside working temperature should be in the neighborhood of 71° C. to 75° C. The junction temperature and the working temperature determine the type of metallic composition to be employed.

There are a number of suitable metallic compositions that may be utilized in accordance with this invention. The so-called eutectic fusible alloys may be employed. An example of such an alloy has a composition of 52% bismuth, 40% lead, and 8% cadmium. This composition has a melting point of 91.5° C. Another such alloy has a composition of 53% bismuth, 32% lead, and 15% tin. This has a melting point of 96° C. Wood's metal may be employed but in the usual instance its melting point is somewhat low. Wood's metal has a composition of 50% bismuth, 25% lead, 12.5% tin, and 12.5% cadmium. It has a melting point of 70° C. A bismuth amalgam having a composition of 80% mercury and 20% bismuth may be employed and this amalgam has a melting point of 90° C. Rose's metal having a composition of 50% bismuth, 25% tin and 25% lead may be employed. It has a melting point of 94° C. Of course other alloys may be used. Any combination of the above alloys, for instance, may be prepared in a manner well known to those skilled in the art to provide a composite alloy having a melting point within the range of maximum junction temperature and maximum outside working temperature.

So it can be seen that by virtue of the encapsulation as above described, a good heat conducting medium is employed to provide excellent heat transfer from the semiconductor. If, for instance, the junction temperature should exceed the melting point of the metallic composition, the heat of fusion of the metal acts as a thermal barrier to protect the semiconductor element. While it may be that some of the metallic composition will melt under certain conditions wherein the temperature exceeds the melting point of the alloy, due to the bulk of the metallic composition employed and its heat of fusion, most of the metal will remain in the solid state. The heat energy is primarily absorbed by the metal in transferring from its solid to liquid state, without an increase in temperature. Therefore, at least until such time as the metal has changed completely from the solid to the liquid state, the heat generated by the element is quite successfully dissipated without increasing the temperature of the metallic composition surrounding it. The metal therefore functions as an excellent means to conduct heat away from the element.

What has been disclosed and described are some embodiments of the present invention. Other embodiments obvious to those skilled in the art from the teachings herein are contemplated to be within the spirit and scope of the accompanying claims.

What is claimed is:

1. In combination, a housing for housing a semiconductor element having electrodes associated therewith and engaging said element at junction areas thereon, a first coating of electrical insulating material positioned on the exterior surface of said element housing and on the exterior surface of said electrodes to within a terminal portion on the ends thereof, a second coating of metallic composition positioned on said first coating, said composition having a melting point intermediate the maximum junction area temperature for said element and the maximum working temperature of the atmospheric exterior to said element.

2. The combination as claimed in claim 1 wherein said metallic composition is an alloy.

3. The combination as claimed in claim 2 wherein said alloy is a relatively low melting point alloy.

4. The combination as claimed in claim 3 wherein said alloy is selected from the group comprising the eutectic fusible alloys, Wood's metal, bismuth amalgam and Rose's metal.

5. In combination, a housing for housing a semiconductor element having electrodes associated therewith and engaging said element at a junction area thereon, a coating of electrical insulating material positioned on the exterior surface of said element housing and on the exterior surface of said electrodes to within a terminal portion on the ends thereof, an encapsulating housing for said element housing, said element housing being positioned within said encapsulating housing and a metallic composition within said encapsulating housing surrounding said element housing and occupying substantially the remaining volume within said encapsulating housing, said composition having a melting point intermediate the maximum junction area temperature of said element and the maximum working temperature of the atmosphere exterior to said element.

6. In combination, a housing for housing a semiconductor element having electrodes associated therewith and engaging said element at junction areas thereon, an encapsulating housing, means positioning said element housing within said encapsulating housing, a metallic composition surrounding said element housing and substantially occupying the remaining volume of said encapsulating housing, said composition having a melting temperature between the maximum junction area temperature of said element and the maximum working temperature of the atmosphere exterior to said element.

No references cited.